US008037266B2

(12) United States Patent
Teicher et al.

(10) Patent No.: US 8,037,266 B2
(45) Date of Patent: Oct. 11, 2011

(54) APPARATUS AND METHOD FOR ARCHIVING DIGITAL CONTENT

(75) Inventors: Mordechai Teicher, Hod-Hasharon (IL); Eyal Bychkov, Hod-Hasharon (IL)

(73) Assignee: SanDisk IL Ltd., Kfar Saba (IL)

( * ) Notice: Subject to any disclaimer, the term of this patent is extended or adjusted under 35 U.S.C. 154(b) by 373 days.

(21) Appl. No.: 11/964,067

(22) Filed: Dec. 26, 2007

(65) Prior Publication Data

US 2008/0162797 A1    Jul. 3, 2008

Related U.S. Application Data

(60) Provisional application No. 60/883,070, filed on Jan. 2, 2007.

(51) Int. Cl.
*G06F 12/00* (2006.01)

(52) U.S. Cl. ......... 711/162; 711/103; 711/114; 365/222

(58) Field of Classification Search .................. 711/161, 711/103, 114, 162; 365/222
See application file for complete search history.

(56) References Cited

U.S. PATENT DOCUMENTS

| | | | |
|---|---|---|---|
| 5,365,486 A | 11/1994 | Schreck | |
| 5,511,020 A | 4/1996 | Hu et al. | |
| 5,625,791 A | 4/1997 | Farrugia et al. | |
| 5,680,579 A * | 10/1997 | Young et al. | 711/157 |
| 5,724,285 A | 3/1998 | Shinohara | |
| 5,909,449 A | 6/1999 | So et al. | |
| 6,240,032 B1 | 5/2001 | Fukumoto | |
| 6,522,586 B2 | 2/2003 | Wong | |
| 6,732,230 B1 * | 5/2004 | Johnson et al. | 711/114 |
| 7,184,264 B2 | 2/2007 | Le | |

(Continued)

FOREIGN PATENT DOCUMENTS

GB       2407405       4/2005

(Continued)

OTHER PUBLICATIONS

Digital Video Archives: Managing Through Metadata Howard D. Wactlar and Michael G. Christel Carnegie Mellon University *,Building a national Strategy for Digital Preservation: Issues in Digital Media Archiving* pp. 1-17.

(Continued)

*Primary Examiner* — Jared Rutz
*Assistant Examiner* — Kalpit Parikh
(74) *Attorney, Agent, or Firm* — Martine Penilla & Gencarella LLP

(57) ABSTRACT

An improved memory card includes an interface for receiving content from an appliance, a primary memory, a secondary memory, and primary controller. The primary controller is configured to selectively write the content only on the primary memory card, or only on the secondary memory card, or on both memories. The improved memory card also includes an enclosure for enclosing the primary memory, the secondary memory, the primary host interface and the primary controller. The improved memory card also includes a user interface that includes a user-operable mode switch that is switchable between a "full capacity" mode and a "full redundancy" mode. In the "full capacity" mode the secondary memory is used for recording genuine content, whereas in the "full redundancy" mode the secondary memory is used for backing up content that has been recorded on the primary memory. A digital shoebox is also provided, which can use improved memory cards and conventional memory cards alike for archiving content.

13 Claims, 7 Drawing Sheets

U.S. PATENT DOCUMENTS

| | | | |
|---|---|---|---|
| 7,325,090 B2 * | 1/2008 | Ronen | 711/106 |
| 2001/0002172 A1 | 5/2001 | Tanaka et al. | |
| 2003/0021149 A1 | 1/2003 | So et al. | |
| 2003/0147277 A1 | 8/2003 | Hsu | |
| 2005/0243626 A1 | 11/2005 | Ronen | |
| 2006/0053308 A1 * | 3/2006 | Zimmerman | 713/193 |
| 2007/0050569 A1 * | 3/2007 | Haustein et al. | 711/154 |
| 2007/0120860 A1 | 5/2007 | Fredlund et al. | |
| 2007/0146790 A1 * | 6/2007 | Park | 358/1.16 |
| 2008/0013411 A1 * | 1/2008 | Thorp et al. | 369/30.01 |

FOREIGN PATENT DOCUMENTS

WO    WO2005/106886    11/2005

OTHER PUBLICATIONS

Overview of Technological Approaches to Digital Preservation and Challenges in Coming Years Kenneth Thibodeau *The State of Digital Preservation: An International Persepctive Conference* p. 1-31.
Digital Foci Introduces Media Buddy {archives} Secrets of Home Theatre and High Fidelity.

* cited by examiner

APPARATUS AND METHOD FOR ARCHIVING DIGITAL CONTENT

REFERENCE TO EARLIER-FILED APPLICATIONS

This application claims the benefit of U.S. Provisional Patent Application No. 60/883,070, filed Jan. 2, 2007, the content of which is incorporated by reference herein in its entirety.

FIELD OF THE INVENTION

The present invention relates to archiving data and in particular to archiving user-generated data on removable memory cards.

BACKGROUND OF THE INVENTION

Users are operating portable digital still and video cameras and digital voice recorders for generating personal digital content. Customarily, such appliances record content on removable memory cards. After completing a session of content recording, or when a memory card is filled up, users usually copy the content of the memory card to their personal computer for viewing, listening, editing, printing, archiving, or sharing with others over the Internet or a cellular network or on optical disks. Usually the memory card, or space on the memory card, is then freed and reused for recording additional content.

Often, the recorded content includes personal memories. Such content cannot be reproduced, and therefore must be carefully archived and protected, for decades or even centuries, just like the photo album of grandpa and grandma. While old black & white photos have proven to withstand decades and centuries of storage, digitally-stored content can be destroyed or lost if the hard disk in which they are stored crashes or the storage media deteriorates or becomes inaccessible due to the storage media becoming obsolete; i.e., due to evolution in hardware or protocol standards.

"Digital preservation" is a known discipline for long-term preservation of digital data. Digital preservation uses strategies such as refreshing, where a fresh copy of the data is produced to overcome storage deterioration; migration, where the data is transformed to match a newer protocol or hardware; replication, where redundant copies are produced and stored separately from the original copy; and physical protection against theft, tampering, fire, natural disasters and the like.

Preservation of personal digital content that is originally recorded on flash memory cards is typically done separately from the memory cards, on magnetic or optical disks. This is because the per-megabyte price of flash memory storage is substantially higher than that of magnetic or optical storage. However, magnetic disks will not typically survive more than a few years. Although regular replication of magnetic disk content could extend the life of the stored content forever, many users will fail to strictly follow the required routines. Optical disks generally do not tend to crash, but they require relatively sophisticated procedures for cataloging and accessing their content. Optical disks vary in longevity. Also, the content of optical disks is not accessible in a convenient way, and the quality of optical disks cannot be monitored.

With the falling prices of memory cards, users could use their memory cards as dedicated long-term storage for their recorded content, instead of continually reusing them to record new content. However, the content stored in NAND flash memory cards may deteriorate, and even irreversibly be lost, after a few years, depending on the card design, the flash type, the extent to which the card is used, and the ambient temperature.

Better longevity is offered by one-time programmable (OTP) solid-state memories. Memory cards that use OTP technology offer "write once/read many" (WORM) functionality. In spite of the higher longevity of OTP cards, many users still prefer the flexibility offered by conventional rewritable flash memory cards for selectively erasing unwanted content to free space for additional/new content, or for copying the entire contents to a hard disk or an optical disk and reusing the card for fresh content recording.

It will be appreciated that the need and desire for long-term archiving of recorded content varies greatly according to the nature of the content. For example, pictures and videos taken for experiments or of an unimportant event under poor lighting conditions may be disposable, while pictures taken at a wedding, family event, trip or reunion, as well as pictures of a child, of a rare natural phenomenon, or just pictures of outstanding quality, are considered indispensable. And, along the continuum from disposable to indispensable, there can be many degrees of importance that users may want to decide for themselves. Even within a series of pictures or videos taken at a certain event, there might be some pictures or videos that users would prefer to keep and others that they prefer to delete. Therefore, using OTP cards for both recording content and archiving it may prove unsuitable for many users or under many circumstances.

There is thus a need for solutions for digital preservation of digital content, that are free of the limitations described above.

SUMMARY

The present invention provides systems, devices and methods for archiving digital content using the memory cards on which the digital content is recorded.

DEFINITIONS

By "digital content", or "content" for short, is meant digital data acquired by a user. By "acquired" is meant created, captured, received, purchased or otherwise obtained. Examples of digital content include, but are not limited to, photos, videos, sound recordings, message recordings, word-processing files, electronic mail, etc.

By "digital appliance", or "appliance" for short, is meant a portable device operated by a user for acquiring content. Digital still and video cameras, voice recorders, cellular telephones with content recoding capabilities, palm-top computers, etc., are exemplary digital appliances.

By "computer" is meant a device operable by a user for using previously-acquired digital content. "Using digital content" refers to operations such as viewing, processing, manipulating, printing, copying and transmitting digital content. It will be noted that a digital appliance and a computer may be embodied in a common device, though they need not be. For example, a digital camera can be used to both take photos (hence playing an appliance role) and view those photos (hence playing a computer role). Another example is a notebook computer that includes input devices, such as a keyboard, microphone or camera to record content onto a memory card, and a user interface and peripherals to use content recorded on memory cards.

By "host" is meant a device functionally connectable to a memory card. Appliances and computers are exemplary hosts.

By "removable memory card", or, interchangeably, "memory card" or "card", is meant a removable random-access nonvolatile storage device that can be moved among hosts for acquiring and using digital content. Currently, most common memory cards use NAND flash technology for storage, and are constructed according to standards such as CompactFlash, MultiMediaCard, SecureDigital, MemoryStick, etc, Other memory cards may use OTP (one-time programmable) technology, which usually offer better data retention. However, it will be appreciated that, as far as the present disclosure is concerned, memory cards are not limited to a particular technology or standard. In particular, portable memory devices such as UFD (USB flash disk) are considered "cards" in the current context.

By "digital shoebox", or "shoebox" for short, is meant a container for archiving a plurality of removable memory cards.

The term "RAID" used herein relates to a widely-used technology that relates to a Redundant Array of Independent Drives, and more specifically to mirroring two disks, transparently to the user, to maintain data backup, for example under the RAID-1 standard.

As part of the present disclosure,. a novel memory card is provided (referred to herein as an "improved memory card"). In one example embodiment of the present disclosure the improved memory card includes a primary memory; a secondary memory; a primary host interface for receiving content from an appliance; and a primary controller that is configured to selectively write the content only on the primary memory card, or only on the secondary memory card, or on both memory cards. The primary memory, secondary memory, primary host interface and primary controller are physically enclosed, or packaged, in a common enclosure. In another example embodiment of the present disclosure the improved memory card includes also a secondary host interface to backup the primary host interface; and a secondary controller to backup the primary controller. The secondary host interface and the secondary controller may provide access from a host device to the secondary memory even if the primary host interface, or the primary controller, or both, fail.

The memory card may include a user interface. The user interface may include a mode switch that is switchable between a full capacity mode and a full redundancy (i.e., backup) mode. Alternatively or additionally, the user interface may include a card status indicator for indicating a status of the primary memory, or the secondary memory, or both memories, where the status includes one of. (i) a memory being empty or full, (ii) content is, can be, or has been, recorded on the secondary memory subsequent to the primary memory being filled-up. By "recording on the secondary memory subsequent to the primary memory being filled-up" is meant using the secondary memory as a contiguous, or successive, storage of the primary memory after the primary memory gets filled up. The status indicator may include one or more Light Emitting Diodes (LEDs), In one example embodiment the primary memory, or the secondary memory, or both, are one-time-programmable (OTP) memory. In another example embodiment the primary memory, or the secondary memory, or both, are NAND flash memory. In another example embodiment the secondary memory is a one-time-programmable memory whose storage capacity is smaller than the storage capacity of the primary memory.

As part of the present disclosure, a method of recording content in the novel memory card is provided. The method may include receiving content from an appliance; selecting whether to write the content only on the primary memory, or only on the secondary memory, or on both the primary and secondary memories; and writing the content according to the selection. Selection of the memory or memories into which the content should be stored may be performed by reading the status of a mode switch. Depending on the circumstances, content may be written into the secondary memory subsequent to the primary memory being filled-up, or into both memories substantially simultaneously. In one example embodiment writing the content includes connecting the memory card to a computer that has a user interface; receiving, through the user interface, user instructions to select a portion of the content of the primary memory for backup; and copying the portion of the content of the primary memory to the secondary memory.

As part of the present disclosure, a digital shoebox is provided, which includes a card compartment for receiving a plurality of memory cards; and a digital shoebox controller that is configured to maintain the plurality of memory cards. Maintaining the memory cards may include monitoring of the media quality (i.e., monitoring of the quality of the plurality of memory cards), and calling for user intervention if at least one of the plurality of memory cards has a media quality that falls below a predefined threshold. Maintaining may also include backing up content of one or more of the plurality of memory cards internally (i.e., in the card's secondary memory) or externally (i.e., in another memory card or in an external backup storage device that is connected to the digital shoebox). Maintaining may also include refreshing content of one or more of the plurality of memory cards. The digital shoebox controller may prompt a user of the shoebox to add an additional memory card for providing a backup storage space for content of a particular memory card, or to replace a memory card whose content integrity or media quality has decreased below a predefined threshold. Maintaining may include periodically monitoring the memory cards for content integrity.

DETAILED DESCRIPTION

The claims below will be better understood by referring to the present detailed description of example embodiments.

This description is not intended to limit the scope of claims but instead to provide examples.

Overview

Some example embodiments of the present disclosure offer one or more of the following functionalities:

- a digital shoebox that accommodates or receives a plurality of memory cards and logically aggregates them into a single virtual disk which is accessible by a host (e.g., a computer);
- a maintenance routine that monitors the quality of the memory cards, routinely refreshes the content stored within the received memory cards, manages backup within or between cards, and calls for user intervention upon detecting problems with data integrity, storage quality, or insufficient backup storage space; and
- a memory card that has a built-in redundancy capability.

The System

Figure 1:
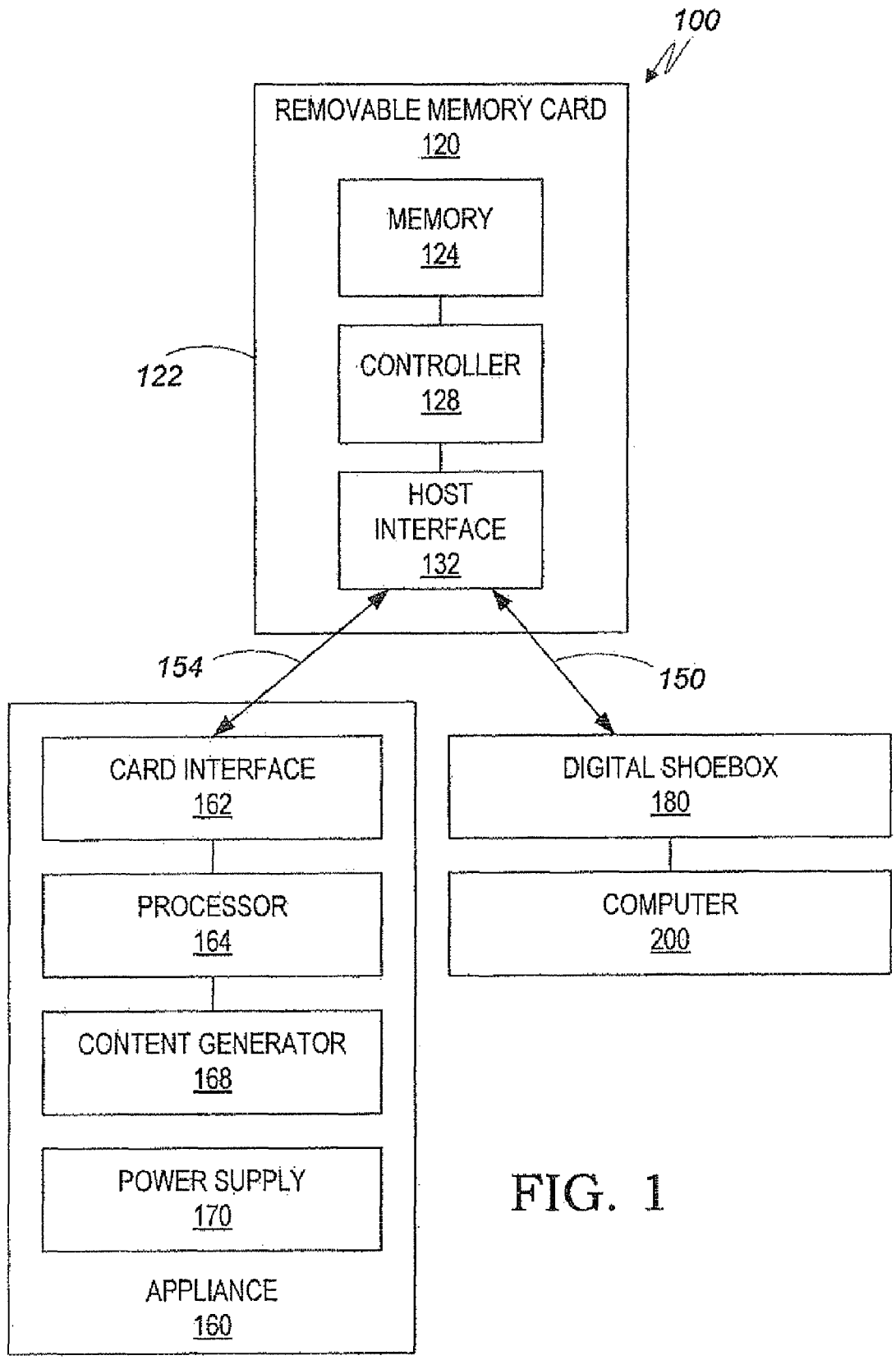
FIG. 1 schematically illustrates a general layout and functionality of a system according to one example embodiment of the present disclosure.

Reference is now made to FIG. 1. System 100 includes a plurality of removable memory cards such as removable memory card 120, one or more appliances such as appliance 160, one or more digital shoeboxes such as digital shoebox 180, and one or more computers such as computer 200. Digital shoebox 180 can provide a user interface, which renders computer 200 optional. A removable memory card 120 may be removably inserted into, or engaged with, an appliance 160 for recording content, and then (if so desired), accommodated in a digital shoebox 180, for long-term archiving of its digital content. A digital shoebox 180 may be removably connected to computer 200 to enable using the content received from one or more removable memory cards 120, or for checking the status of these memory cards while these memory cards are accommodated within digital shoebox 180, or for monitoring the storage media quality or maintaining the memory cards. The status of the memory cards may include, for example, a memory being empty or full.

A removable memory card 120 includes a nonvolatile memory 124 for enabling a host (such as appliance 160) to record, read and delete content in a conventional manner. Memory 124 may be, e.g., a rewritable NAND flash memory, or an OTP (one-time programmable) memory. Host interface 132, which may be, for example, a Universal Serial Bus (USB), CompactFlash, SecureDigital or MemoryStick interface, is used to connect removable memory card 120 (i) to appliance 160 for recording and managing content, and (ii) to digital shoebox 180 for archiving the card's content, monitoring the card's quality and status and managing refreshment and backup routines, as is discussed below. Memory 124, controller 128, and host interface 132, are shown in FIG. 1 packaged in a common enclosure 122. In some example embodiments of the present disclosure, removable memory card 120 is a conventional memory card. In some example embodiments, controller 128 may be programmed to take part in some or all of the monitoring and/or refreshment processes described below. In yet other example embodiments of the present invention the memory card has an improved construction that includes at least a backup memory, as discussed in connection with FIG. 2 below.

An appliance 160, which may be, for example, a digital still or video camera, a voice reorder, a cellular telephone or a portable computer, temporarily accommodates a removable memory card 120 for recording digital content. Appliance 160 typically includes a card interface 162 to establish communication with removable memory card 120 via connection link 154; a processor 164 for managing such communications; a content generator 168, such as a camera, a voice recorder mechanism or a keyboard, for generating content; and a power supply 170 for energizing the units described above.

Digital shoebox 180 is designed to accommodate multiple removable memory cards 120, and to interface with each one of the multiple accommodated removable memory cards via a respective communication link 150 that is compatible with host interface 132 of the respective removable memory card 120. Communication link 150 can conform to the Universal Serial Bus (USB), CompactFlash, SecureDigital or MemoryStick standard, for example.

Computer 200 may be connected, temporarily or permanently, to digital shoebox 180 for providing a user with a convenient interface (e.g., a Graphical User Interface-GUI) for controlling digital shoebox 180 and for using the content stored in the memory cards. In some example embodiments, computer 200 logically treats ("sees", handles or interacts with) the cards accommodated in digital shoebox 180 as a single memory disk, where content items, such as a picture, video segment or clip, audio segment, or word-processing document, can be accessed individually and used conventionally, for example by being browsed, displayed/heard, printed, copied, emailed etc., in a conventional manner. Computer 200 can be a general purpose personal computer (PC) with suitable software, or a computer which is dedicated for interfacing with digital shoebox 180. Computer 200 may be embodied in an appliance 160, which may be, for example, a cellular telephone that can be used both to acquire content (i.e., via its digital camera) and to use the acquired content, such as by sending content already stored in one of the cards accommodated within digital shoebox 180 to another telephone via the cellular network.

The Improved Memory Card

Figure 2:
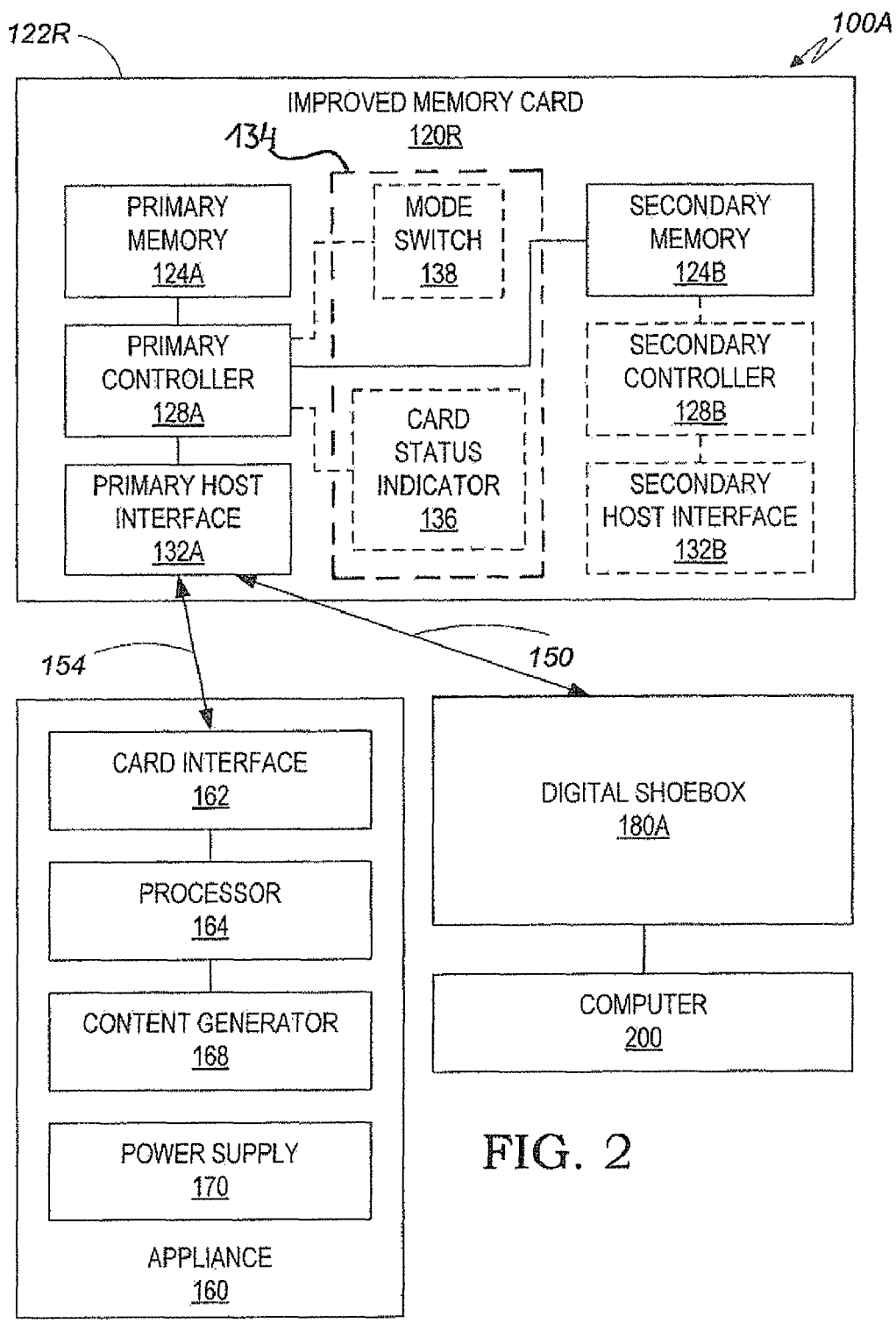
FIG. 2 schematically illustrates a general layout and functionality of a system according to another example embodiment of the present disclosure.

FIG. 2 shows a system (generally shown at 100A) that is similar to system 100 of FIG. 1, except that at least one of the memory cards (shown at 120R) to be accommodated or received in the shoebox is an improved memory card, and the digital shoebox 180A is also programmed, configured, adapted, or designed, to accommodate and manage improved memory cards.

Improved memory card 120R includes a primary memory 124A, a primary controller 128A, a primary host interface 132A, a secondary memory 124B, a secondary controller 128B, and a secondary host interface 132B, which are physically packaged in a common enclosure 122R. Primary memory and secondary memory are physically separate memories. They are physically separate in the sense that they reside either on separate semiconductor wafers, or on separate dies, or in separate electronic chips. In microelectronics, a "wafer" is a thin slice of semi-conducting material, such as a silicon crystal, upon which microcircuits are constructed, for example by doping. A die is a small block of semi-conducting material on which a given functional circuit is fabricated. Typically, integrated circuits are produced in large batches on a single wafer. Secondary controller 128B and a secondary host interface 132B are optional elements of the system shown in FIG. 2, as indicated by the dashed lines. Under a first optional mode of operation, when improved memory card 120R is retired in digital shoebox 180A, a replica of the content of primary memory 124A is stored in secondary memory 124B. This way, in case data is lost or corrupted in one of the memories, for example in primary memory 124A, the content will still be obtainable or recoverable from the other memory, in this example from secondary memory 124B. Also, digital shoebox 180A may execute check routines to identify discrepancies between digital contents of primary memory 124A and digital contents of secondary memory 124B. If there is no perfect match between them, computer 200 may prompt the user to insert a blank memory card into shoebox 180A and, assuming such a card has been inserted, computer 200 may cause digital shoebox 180A to store in the blank memory card a replica of the uncorrupted content. Another beneficial feature of improved memory card 120R is the capability of maintaining full real-time content redundancy when content is recorded from appliance 160 to improved memory card 120R. Sometimes, in important events, digital photographers use two cameras so that if one camera malfunctions they would still be able to use the other. If the event is very important, the photographers would take similar shots using the two cameras, so as to have some sort of redundancy. However, using an improved memory card such as improved memory card 120R provides redundancy within the same memory card.

For real-time redundancy, primary host interface 132A can operate as a RAID-1 controller of primary memory 124A and secondary memory 124B, thus maintaining full data redundancy transparent to the user. Regarding the other feature discussed above, when improved memory card 120R is retired in digital shoebox 180A, data redundancy already exists without the digital shoebox 180A commencing the data replication mechanism discussed above. By "memory card 120R is retired in digital shoebox 180A" is meant that memory card 120R is permanently coupled to the digital shoebox 180A, or memory card 120R is coupled to the digital shoebox 180A with the intention to leave it there permanently, so as to create with other memory cards a single virtual disk drive. Regarding computer storage devices, a RAID ("Redundant Array of Independent Drives" (or Disks)), also known as "Redundant Array of Inexpensive Drives" (or Disks) is an industry standard that encompasses data storage schemes that divide and/or replicate data among multiple hard drives. A number of standard schemes have evolved which are referred to as levels. The first level (designated as "RAID-1") creates an exact copy (or mirror, or replica) of a set of data on two or more disks in a way that is transparent to the host.

A method is provided for recording content in an improved memory card such as improved memory card 120R, which is interfaced with an appliance such as appliance 160. With reference to FIG. 2, the method may include receiving content from appliance 160; selecting whether to write the content only on primary memory 124A, or only on secondary memory 124B, or on both primary memory 124A and secondary memory 124B; and writing the content to a selected memory or to both memories. Primary controller 128A may select the memory or memories for storing the data, for example by reading the status of a user operable mode switch such as mode switch 138.

A memory card such as improved memory card 120R offers several storage options or modes. A first storage option is full redundancy (and, consequently, half capacity). This option involves recording genuine content in the primary memory 124A and, substantially simultaneously, in the secondary memory 124B. By "substantially simultaneously" is meant either in parallel, concurrently, or after a short delay that depends on the type of appliance used to record the content. According to this storage option, it may be said that primary memory 124A holds the genuine content, whereas the secondary memory 124B holds a copy or replica of the genuine content. For example, a user may purchase a memory card like improved memory card 120R with a total of 2 GB (gigabyte) storage capacity, and decide to use the memory card as a 1 GB card with full content redundancy. This means that the user can store genuine content in a first 1 GB of the 2 GB memory card, and a copy or replica thereof in the other 1 GB of the 2 GB memory card.

A second storage option is full capacity (and, consequently, no redundancy). This option involves using the memory card in a regular manner (as opposed to using it with a redundancy or backup capability, as discussed in connection with the first option). More specifically, this option involves starting recording genuine content in the primary memory 124A, and, subsequent to the primary memory 124A being filled up, continuing recording genuine content in the secondary memory 124B. With reference to the exemplary 2 GB card above, the user utilizes, according to the second option, the entire capacity (i.e., 2 GB) of the memory card to record genuine content.

Switching from the first option (i.e., "full redundancy") to the second option (i.e., "full capacity") after some content has already been recorded results in a third storage option. The third option involves initially setting the improved memory card to "full redundancy" (i.e., according to the first option discussed above), starting recording genuine content in primary memory 124A, with a copy or replica thereof being recorded in the secondary memory 124B, and then switching to "full capacity". The third option is useful, for example, if a user redundantly records content in improved memory card 120R and, at some point, the user needs an extra recording capacity but does not have another memory card at hand. In this case, the user can switch from the "full redundancy" option to the "full capacity" option, and the resulting recording behavior will depend on the status of primary memory 124A. That is, if primary memory 124A is full when the second option is selected instead of the first option (which means that secondary memory 124B is also full), then selecting now the "full capacity" option will result in overwriting redundant content in secondary memory 124B. However, if primary memory 124A is not full (which means that secondary memory 124B is also not full), then selecting now the "full capacity" option will result in recording new genuine content in primary memory 124A and then (i.e., after filling the primary memory 124A) in secondary memory 124B until the storage available in secondary memory 124B (hence all the storage available in memory card 120R) is used up, while yet maintaining the redundancy of the content that had already been recorded in primary memory 124A prior to switching modes. Thus, in this case, secondary memory 124B will contain both (i) content redundant with a portion of the content of primary memory 124A and (ii) genuine new content. Primary memory 124A will contain some content for which no backup content is stored in secondary memory 124B.

Switching from the second option (i.e., "full capacity") to the first option (i.e., "full redundancy") results in a fourth storage option. The fourth option involves initially setting the improved memory card to "full capacity" (i.e., according to the second option discussed above), starting recording genuine content in the primary memory 124A and then switching to "full redundancy". The fourth option is useful, for example, if a user starts recording relatively less important content in primary memory 124A and at some point, before primary memory 124A is fully consumed, the user decides that the next content she wishes to record is more valuable. In this case the more valuable content can be stored in the storage space left in the primary memory 124A, with a copy or replica thereof stored in the secondary memory 124B. It is noted that switching from the "full capacity" option to the "full redundancy" option can be done only if primary memory 124A is not full. Otherwise (i.e., in the case that primary memory 124A is full), new content can be recorded only in secondary memory 124B, which means that the new content will not have a redundant copy.

Mode switch 138 and card status indicator 136, which are optional elements of the system shown in FIG. 2, add supportive or supplemental functionalities to the various options described above. Mode switch 138, a user operable switch, is designed so that it can be moved or flipped by the user between two positions, each position representing a respective mode: (1) "half capacity, full redundancy" mode, which will present the card as having only the capacity of primary memory 124A and keep or use the secondary memory 124B for backing up the content of primary memory 124A, and (2) "full capacity, no redundancy" mode, which will allow using the storage space of both primary memory 124A and secondary memory 124B for genuine content, and present the sum of their capacities as the improved memory card 120R full capacity. Mode switch 138, which may be part of a user interface 134, may be implemented by any suitable user operable selector. Alternatively or additionally, user interface 134 may include a card status indicator, such as card status indicator 136, which may be implemented, for example, as a Light Emitting Diode (LED). The card status indicator may include one or more Light Emitting Diodes (LEDs), or other display means, such as, but not limited to, a Liquid Crystal Display (LCD) screen. Mode switch 138 may be integrated, for example into the side of the card opposite the side of the card's electrical connector, so as to make it visible to the user even when the memory card is inserted into appliance 160. By causing blinking of a green light when the storage area of primary memory 124A is less than 90% full, a yellow light when it is in the range 90%-100%, and a red light when data received from appliance 160 is started to be recorded directly into secondary memory 124B, the user is provided with an indication as to the status of the memory card(s). "Full redundancy" and "full capacity" modes may be signaled to the user, for example by using a distinctive light or a combination of two lights; e.g., green light and red light. Using a LED indicator in the way described above is only an example, as other indicating means, indicating schemes and/or colors can alternatively or additionally be used. It is noted that user interface 134 is optional. User interface 134 may include either mode switch 138 or card status indicator 136 or both the mode switch 138 and card status indicator 136.

It is noted that primary memory 124A, secondary memory 124B, or both memories, may be implemented as rewritable memories, such as NAND flash memories, or as OTP (one-time-programmable) solid state memories. However, since OTP memories can be written to only once, a secondary memory 124B, if implemented using OTP technology, cannot properly, or fully, support the third storage option described above. Therefore, under such circumstances, the third option may be available in a limited capacity or may not be available.

In one example embodiment of the present disclosure primary memory 124A is a flash memory and secondary memory 124B is an OTP memory. Because recording content in an OTP memory cannot be undone, it would be recommended to use such a memory only as a backup. For economic reasons, the OTP secondary memory 124B may be smaller (i.e., in its storage capacity) than primary memory 124A. For example, if primary memory 124A is 1 GB, the OTP secondary memory 124B may be 250 MB. Under such circumstances, improved memory card 120R should not include mode switch 138 because the card's user should not be given the option of recording content in secondary memory 124B by mistake or at random. Not having mode switch 138 means, therefore, that only one operational mode is available for the user, namely, recording on primary memory 124A whatever content the user wishes to record, and then, at a later stage and using another type of host (e.g., a computer having a card reader), selecting from primary memory 124A only the most valuable content that the user wishes to backup on the OTP secondary memory 124B. Content to be backed up on the OTP secondary memory may be selected for the backup process using any conventional method, for example by checking a box associated with selected content, or by copying selected content to a dedicated "backup" directory.

While replicating the data of primary memory 124A onto secondary memory 124B provides good protection against memory malfunction, data can still be lost if primary controller 128A, or primary host interface 132A, or both, fail. To cope with this problem, a secondary or redundant controller, such as secondary controller 128B, is used, as well as a secondary or redundant host interface such as secondary host interface 132B. Secondary controller 128B and secondary host interface 132B can provide access from a host device to the secondary memory 124B even if primary controller 128A, or primary host interface 132A, or both, fail.

Primary memory 124A and secondary memory 124B are user memories. Customarily, with each of primary controller 128A and primary controller 128B is associated a "firmware memory" that stores the firmware (FW) required to operate the respective controller. In one example embodiment of the present disclosure both firmware memories (not shown in FIG. 2) are flash memories. In another embodiment of the present disclosure the firmware memory associated with primary controller 128A is a flash memory and the firmware memory associated with secondary controller 128B is an OTP memory. The respective firmware memories may also be other kinds of memories.

The Digital Shoebox

Figure 3:
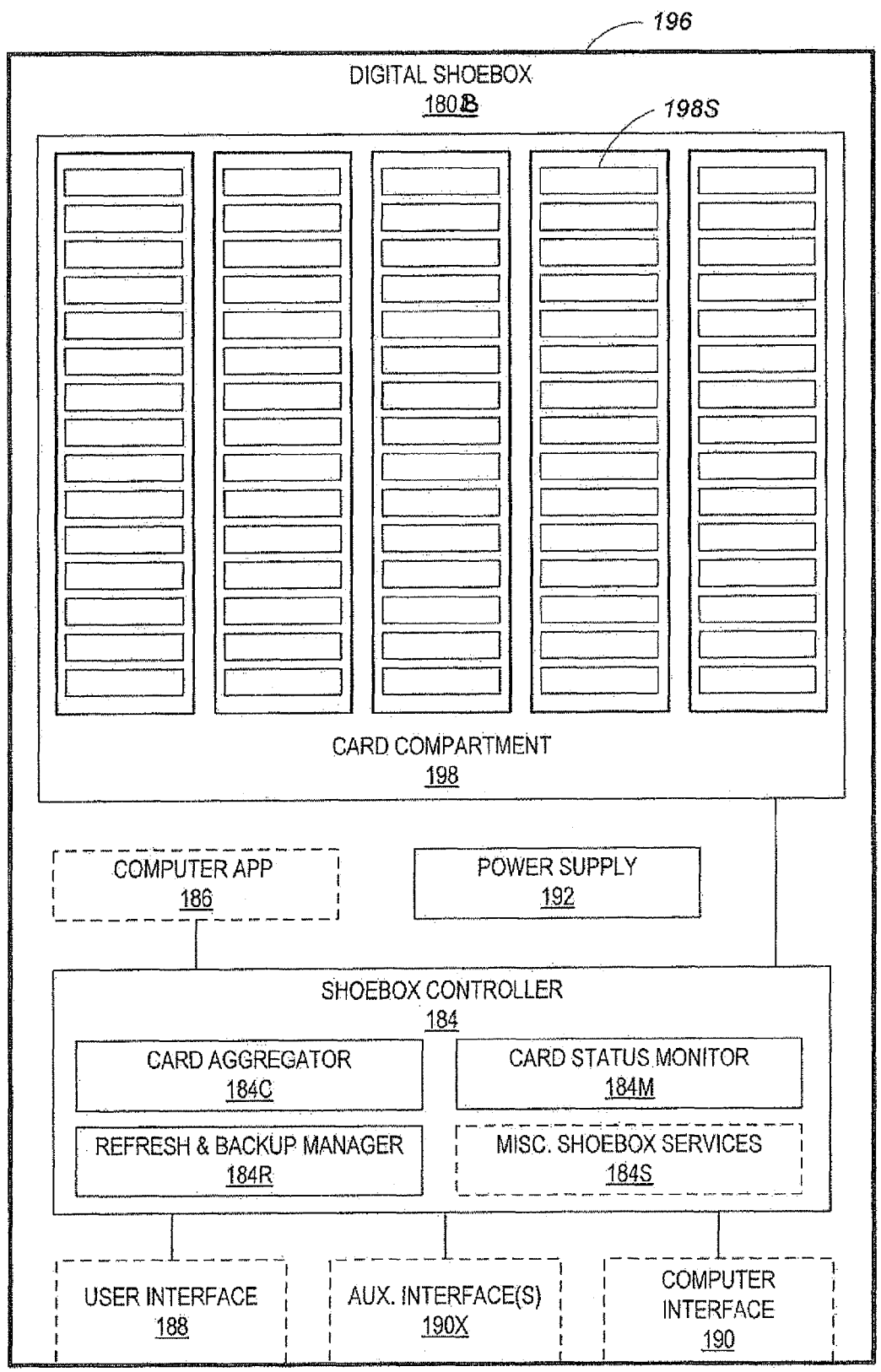
FIG. 3 schematically illustrates a digital shoebox in accordance with one example embodiment of the present disclosure.

Reference is now made to FIG. 3, wherein digital shoebox 180B is understood to represent either digital shoebox 180 of FIG. 1 or digital shoebox 180A of FIG. 2, in more detail. With regard to the difference between digital shoebox 180 of FIG. 1 and digital shoebox 180A of FIG. 2, shoebox controller 184 of FIG. 3 is programmed, configured, adapted, or designed to manage both the memory cards 120 of FIG. 1 and the improved memory cards 120R of FIG. 2. Digital shoebox 180B of FIG. 3 includes enclosure 196 such as a case that physically encloses the other components described below and protects them from theft, humidity, dust, temperature, stress, shock, and the like. Card compartment 198 can receive or accommodate, in its plurality of card slots 198S, a plurality of memory cards 120 or a plurality of improved memory cards 120R, or a combination of such memory cards. Shoebox controller 184 manages the monitoring and maintenance of the cards in card compartment 198, and also the communication between these cards and external devices/computers, through shoebox user interface 188, computer interface 190 and auxiliary interface(s) 190X, these interfaces being optional. Power supply 192 energizes shoebox controller 184 and its interfaces, and is of conventional construction, which may include a battery backup circuit.

Optionally, the digital shoebox 180B of FIG. 3 may include a computer application 186, which includes computer-executable code to be uploaded to, and run on, an external such as computer 200 of FIG. 1 or FIG. 2 (for example). Throughout the description of FIG. 3, and elsewhere if applicable, it will be assumed that the external computer, to which digital shoebox 180B is connected, is computer 200 of FIG. 1 or FIG. 2, which is only an example of an external computer. External computer 200 may be connected to digital shoebox 180B via computer interface 190, which allows exploiting and controlling various functionalities of digital shoebox 180B via computer 200, and these functionalities can be exploited without requiring another special-purpose software source for computer 200.

Shoebox controller 184 may include hardware and firmware modules for executing various functions. Card aggregator 184C is a controller module dedicated to consolidate, or aggregate, all the memory cards accommodated in card compartment 198 into a single disk that can be accessed or used through computer interface 190, shoebox user interface 188, or auxiliary interface(s) 190X. Card aggregator 184C may be configured, designed, or adapted, for example, to the specifics of host interface 132 of FIG. 1, or primary host interface 132A of FIG. 2. For example, if host interface 132 of FIG. 1 is a USB interface, card aggregator 184C is, or can serve as, a USB hub; for other types of interfaces 132, card aggregator 184C can implement the teachings of U.S. Pat. No. 7,184,264 to Le, as will be understood by one of ordinary skill in the art. Card status monitor module 184M may, under a predefined schedule, regularly scan the data integrity, including the redundant or replicated data in all memory cards accommodated in card compartment 198. Memory cards may be scanned using a predefined schedule. Refresh & backup manager 184R may execute a prescheduled refreshment routine to read and rewrite the content of the memory cards accommodated in card compartment 198, to thereby extend the data retention of the memory cards. Refreshing the content of a memory card may be performed under a predefined schedule or as needed according to quality monitoring. Data refreshing techniques are known in the art, and are taught, for example, in U.S. Pat. Nos. 5,365,486; 5,511,020; 5,625,791; 5,724,285; 5,909,449; 6,240,032; and 6,522,586, and in U.S. Patent Application Publication Nos. 2003/0147277, 2003/0021149, 2001/0002172, and 2005/0243626.

Also, refresh & backup manager 184R executes a backup routine whenever a new memory card (i.e., a "content" card) is inserted into card compartment 198: if the newly added content card is a conventional card similar to removable memory card 120 of FIG. 1, then the backup routine may prompt the user, via shoebox user interface 188 of FIG. 3 and/or via computer 200 of FIG. 1 (for example), to insert into a free slot 198S in the card compartment 198 a blank "backup" card with sufficient storage capacity to accommodate a copy of the content of the newly-added content card. If the newly-added content card is an improved memory card 120R (i.e., it is a self-contained memory card), then refresh & backup manager 184R may communicate with primary controller 128A of FIG. 2 to ensure that a replica of the content is properly maintained in the improved memory card 120R, or otherwise prompt the user to insert an empty ("blank") backup memory card as described above.

Miscellaneous shoebox services module 184S is an optional element that may be included to provide services via shoebox user interface 188 and/or auxiliary interface(s) 190X, for using the content (e.g., viewing, processing, printing, copying, transmitting) of the cards accommodated in card compartment 198. It is noted that, depending on specific design, configuration and price considerations, the content of the memory cards in card compartment 198 can be monitored using either external computer 200, or an extended user interface 188 that includes a display screen and a keyboard that are supported by appropriate programming of miscellaneous shoebox services module 184S.

Computer interface 190 connects digital shoebox 180B and an external computer such as computer 200. Computer interface 190 may use either wired (e.g. USB) or wireless (e.g. Wi-Fi) technology, allowing a user of computer 200 to access and use the content of the cards accommodated in card compartment 198. Computer interface 190 may optionally be used to upload computer application 186 from digital shoebox 180B to computer 200, and to exhibit reports generated by card status monitor module 184M to the user of computer 200.

Digital shoebox user interface 188 may include an indicator to indicate the status of the memory cards in card compartment 198, as ascertained by card status monitor module 184M. This indicator may include one or more LEDs. For example, a green LED may be switched "ON" after verifying the integrity of the contents on all the cards and, optionally, that the contents are all properly backed up. In another example, a blinking yellow LED may be used to indicate that user action or intervention is requested or required. The indicator may be active even when digital shoebox 180B is disconnected from computer 200, or even when a computer 200 is connected to digital shoebox 180B but the computer 200 is switched "off". Shoebox user interface 188 may also include a display screen to prompt or guide the user as to required or expected action or actions. For example, the display screen may display to the user a textual message such as "Please add a blank 512 MB card", or "Please connect to a computer for detailed or additional instructions". In configurations that support using content directly from digital shoebox 180B, shoebox user interface 188 may include a color Liquid Crystal Display (LCD) screen, a keyboard, a mouse, etc., which may obviate the need to connect digital shoebox 180B to a computer 200.

Auxiliary interface(s) 190X may optionally include a card reader, a USB disk interface, an Internet connection, a printer interface, etc., depending on the standalone content-usage functionalities included in the miscellaneous shoebox services module 184S and supported by shoebox user interface 188.

The Computer

Computer 200 has already been introduced in FIG. 1 as an optional device for using the content of the cards accommodated in digital shoebox 180B, and a convenient user interface for the monitoring and maintenance functionalities of digital shoebox 180B. Computer 200 can be a general-purpose personal computer (PC) with the required software, or a dedicated device designed solely to cooperate with digital shoebox 180B, or a device that has the functionality of both appliance 160 and computer 200.

Figure 4:
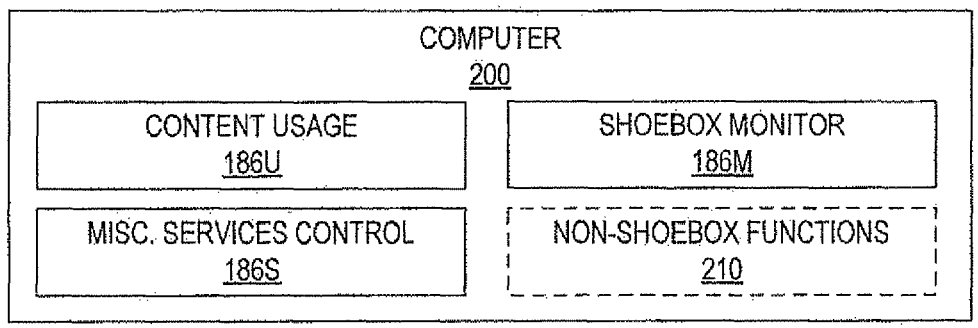
FIG. 4 schematically illustrates a computer configuration in accordance with one example embodiment of the present disclosure.

Reference is now made to FIG. 4, which schematically illustrates the main functional components of computer 200, implemented by software and/or hardware modules. Content usage module 186U enables operations, such as viewing, processing, printing, copying or transmitting, which are associated with the content of the cards accommodated within digital shoebox 180B. Miscellaneous services control module 186S enables operations, such as reading a memory card that is inserted into a card reader, or dialing-up an Internet connection, which are associated with auxiliary interface(s) 190X of FIG. 3. Shoebox monitor 186M monitors the shoebox activities and provides a conventional user interface. Monitoring the shoebox activities by shoebox monitor 186M may be used, for example to check and assure the user that all cards are in good condition (i.e., in terms of content integrity, content backup, and so on), or to call for user intervention if the content integrity and/or the media quality of the memory card has decreased below a predefined threshold, In the case of degraded content integrity or media quality, the user may be prompted, for example, to add a memory card with a certain storage capacity for taking over the backup functionality of a malfunctioning memory card. Optional non-shoebox functions module 210 performs other useful functions such as word-processing, email and Internet browsing, that may be offered to the user of computer 200.

Card Usage

Figure 5:
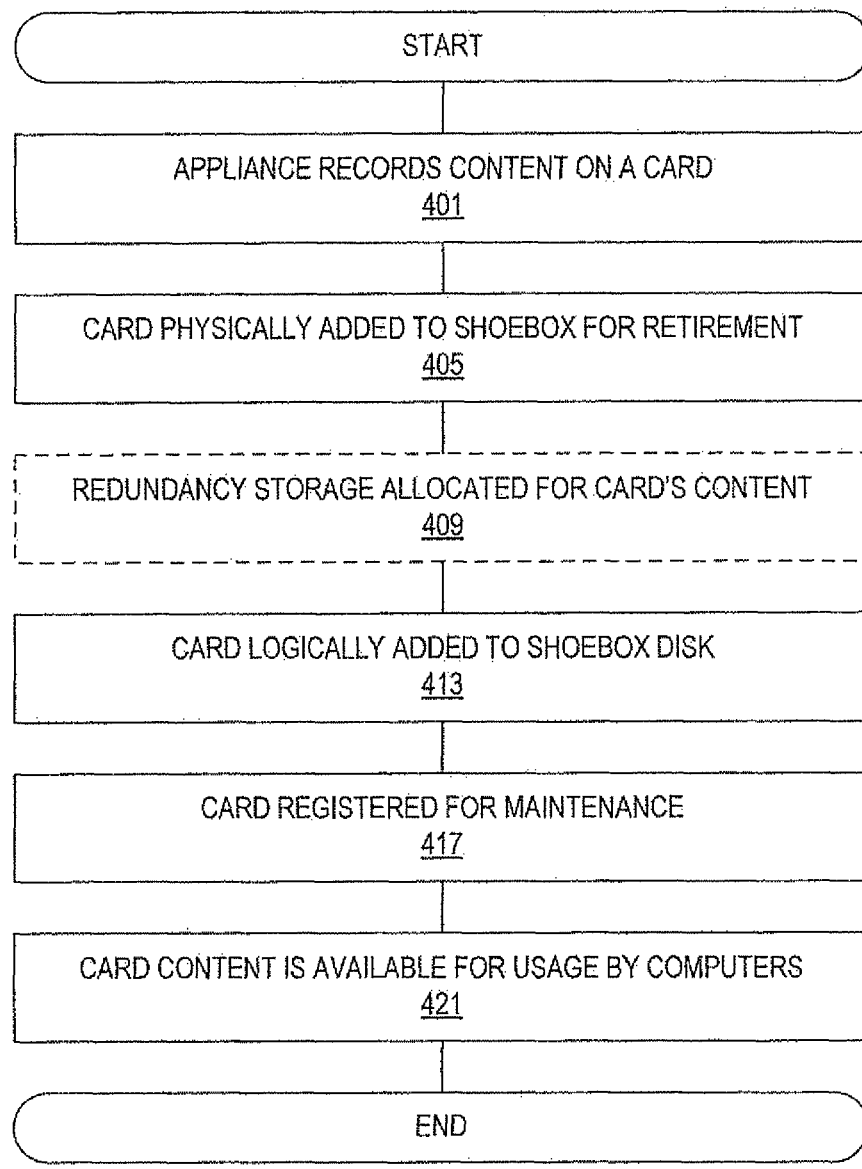
FIG. 5 illustrates an exemplary method for operating the digital shoebox of FIG. 3.

Reference is made to FIG. 5, which describes the usage of removable memory card 120 of FIG. 1. FIG. 5 will be described in association with FIGS. 1 and 3. As discussed above in connection with FIGS. 1, 2 and 3, the digital shoebox can likewise accommodate conventional memory cards 120 of FIG. 1, and improved memory cards 120R of FIG. 2.

In step 401 a removable memory card is used conventionally with an appliance 160 of FIG. 1 to record content. For example, the removable memory card may be used with a digital camera to record picture files or video files.

At some point, either because the memory card is filled up (i.e., it is fully occupied) or the user wants to archive important content, for example, pictures taken at a wedding, the user may insert, in step 405, the memory card for retirement in digital shoebox 180B of FIG. 3. If digital shoebox 180B is programmed, configured, or otherwise set to fill content redundancy mode, then in optional step 409 shoebox controller 184, which detects the addition of the new card made in step 405, allocates backup storage for the card and ensures that the content of the card is copied (i.e., backed up) into the allocated redundancy storage. If the memory card added to the digital shoebox 180B is a conventional card (i.e., it is identical or similar to memory card 120 of FIG. 1), then, in optional step 409, shoebox controller 184 may allocate to the just added memory card sufficient redundancy storage space in another memory card(s) that already resides in the digital shoebox. Then, shoebox controller 184 may store a copy of the content of the memory card in the allocated backup storage space. If, however, the removable memory card that is added to the digital shoebox 180B is an improved memory card; i.e., it is identical or similar to improved memory card 120R of FIG. 2, then the redundancy storage space can internally be provided within the same memory card, by using a secondary memory identical or similar to secondary memory 124B. If secondary memory 124B is already filled up with original content, or there is no sufficient redundancy storage space available in secondary memory 124B for additional content, the shoebox controller 184 may allocate redundancy storage space in another memory card, or prompt the user, by using a computer application such as computer application 186 of FIG. 3, to redefine the storage-redundancy requirement to free redundancy storage space in secondary memory 124B while not backing-up less important content. Alternatively, shoebox controller 184 may prompt the user to add to digital shoebox 180B another memory card (e.g., a blank memory card) with sufficient storage capacity for serving as backup storage. In other cases, the backup memory card may be managed via an auxiliary interface 190X, or in an external storage device or on an Internet server (both not shown in the figures). Thus, in embodiments that support content backup, step 409 may be concluded with the content of the newly added memory card being backed up either by a storage medium that resides within digital shoebox 180B or by a storage medium that resides external to digital shoebox 180B and is accessed via an interface such as auxiliary interface 190X. To find a backup storage space for a particular received memory card the shoebox controller may search in the received memory cards (i.e., the memory cards residing in the card compartment 198 of digital shoebox 180B) for an adequate backup storage space into which content of the particular received memory card can be copied.

As memory cards are added to digital shoebox 180B, the card aggregator 184C regenerates the virtual storage disk file system to thereby update it with each newly added card. The storage disk is "virtual" because it is not a single physical storage medium but, rather, it consists of distributed storage media that can be accessed, viewed and managed like a single storage device. Accordingly, in step 413 the memory card, which was physically added to digital shoebox 180B in step 405, is logically added by card aggregator 184C of FIG. 3 to a virtual storage disk that is presented by digital shoebox 180B as such when accessed, for example, from computer interface 190, auxiliary interface(s) 190X, or from shoebox's user interface 188. In step 417 the memory card is registered in digital shoebox 180 for monitoring and maintenance. "Monitoring" means periodically monitoring the memory card by card status monitor 184M for its content integrity (and redundancy, where appropriate), and "maintaining" means refreshing the memory card by "Refresh & Backup Manager 184R". Registration of memory cards in digital shoebox 180B may be executed, for example, by one of the services offered by miscellaneous services module 184S. In step 421, after the memory card added in step 405 is registered in digital shoebox 180B, its content can be used as it becomes available to the user as part of the virtual disk as presented by digital shoebox 180B via user interface 188, auxiliary interface(s) 190X, or computer interface 190.

Digital Shoebox Maintenance Routine

Figure 6:
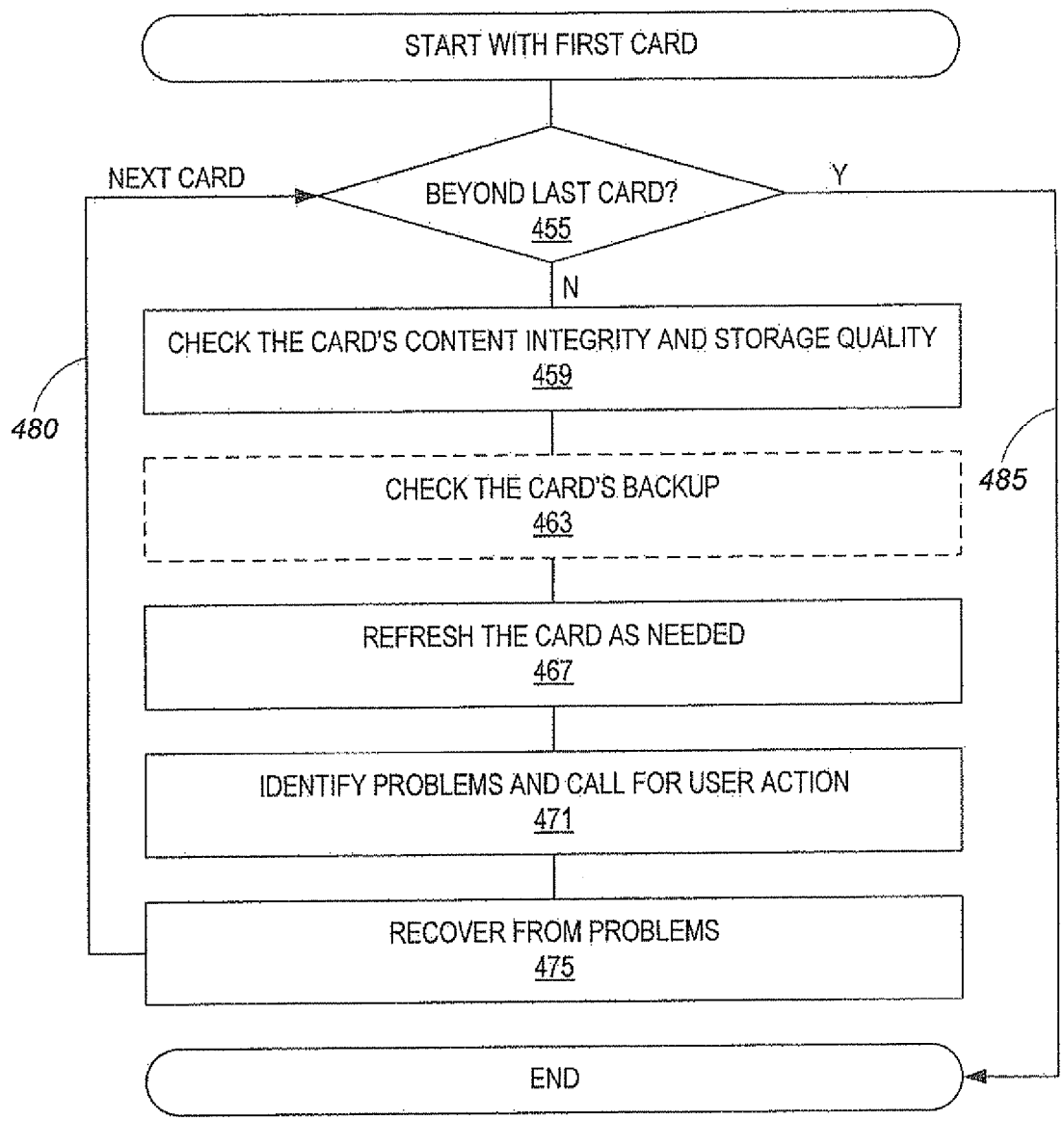
FIG. 6 illustrates another exemplary method for operating the digital shoebox of FIG. 3.

Reference is now made to FIG. 6, which describes a typical maintenance routine of digital shoebox 180B, during which all the memory cards residing within card compartment 198 of FIG. 3 are scanned by shoebox controller 184 according to a predefined schedule, for example once a month, or as needed. During a scan cycle, each of the memory cards is checked as described below. In step 455 it is checked whether the last memory card was acted on the various functionalities of the digital shoebox. If there is a memory card not yet acted on (shown as "N" at step 455) its content integrity and storage media quality are checked in step 459. Checking the content integrity of a memory card may be executed, for example, by using parity checks. Checking the storage media quality may be executed, for example, by quantifying errors associated with the stored data, which have been corrected by using internal error correction mechanisms (e.g., Error Correction Code-ECC) that are commonly used in memory cards. Storage media quality, or media quality for short, may be measured by using other methods which are known to those skilled in the art. In the case of full redundancy/backup, in optional step 463 the backup card is checked for data integrity, storage media quality, and correspondence with the memory card's content. In step 467 the card's content is refreshed under predefined criteria, for example, 6 months after the previous refreshment, or when an excessive level of error correction has been identified in step 459. In general, the more error correction is needed to sustain a card's content, the more frequently the memory card will have to be refreshed. If, during any of the steps 459, 463 or 467, a problem has been encountered, for example, the storage media of a memory card is found to be of poor quality or an unsatisfactory backup cannot be corrected automatically by the card's controller 128A or the shoebox controller 184, then, in step 471, digital shoebox controller 184 may send a warning message to the user, via the digital shoebox user interface 188 (and also to computer 200 if computer 200 is connected to computer interface 190), to call for user intervention. User intervention may typically include adding an additional memory card that will replace a malfunctioning card or provide an additional backup storage space, or copying content to an external backup storage device. After the user has responded to the action requirements of step 471, in step 475 digital shoebox controller 184 of FIG. 3 rectifies the problems mentioned before, for example, by (re)copying the content of a memory card to another memory card that has just been added to the digital shoebox by the user. Steps 459 through 475 are repeated (shown at step 480) for each memory card not acted on. After the digital shoebox acts on the last memory card (shown as "Y" at step 455), the scan cycle is terminated (shown at 485). It is noted that an automated scan cycle may encompass every memory card that is accommodated in a digital shoebox, but a user of the digital shoebox may select memory cards for maintenance and use a shortened scan cycle that encompass only the selected memory cards.

Using an Improved Card

Figure 7:
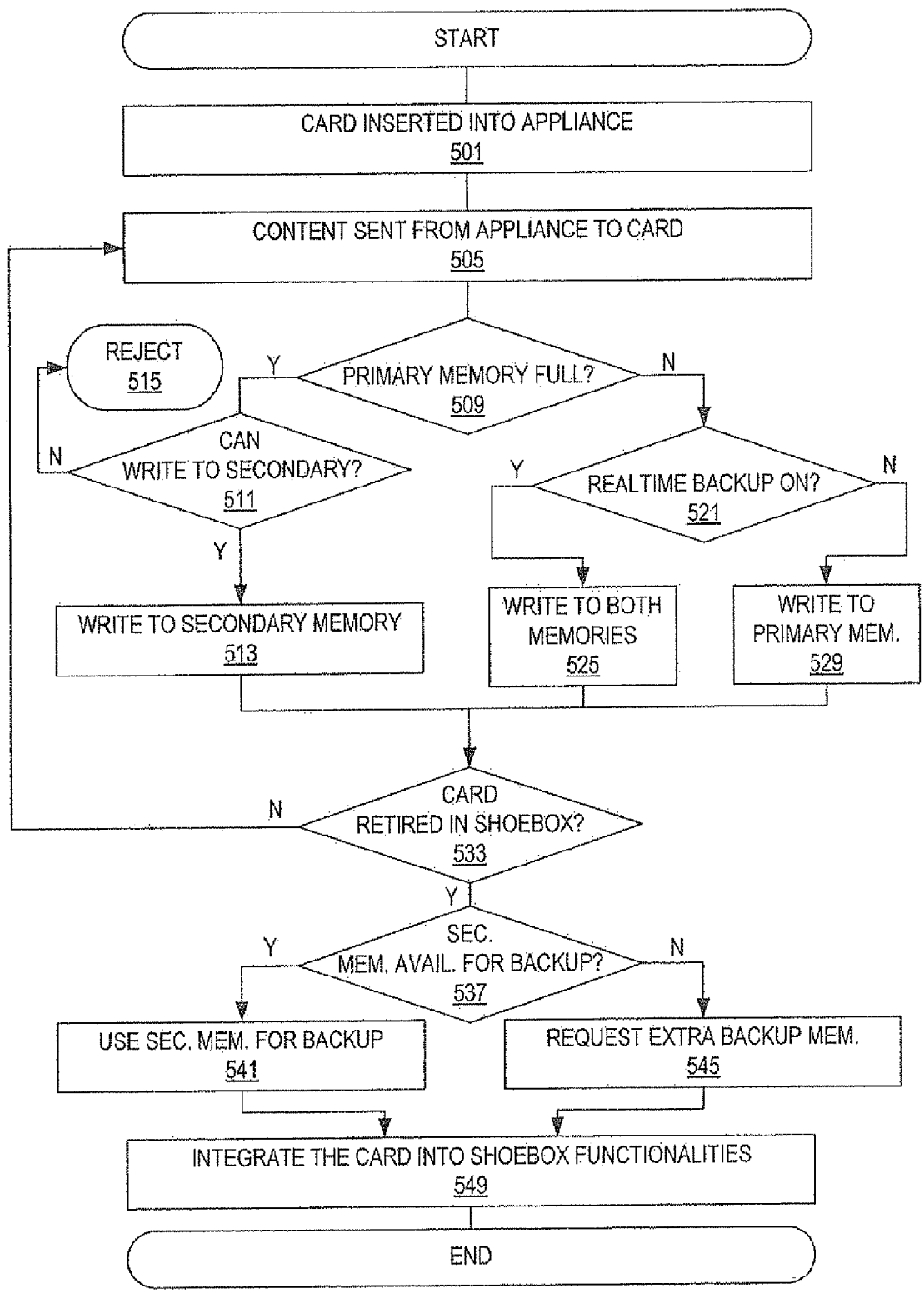
FIG. 7 illustrates yet another exemplary method for operating the digital shoebox of FIG. 3.

Reference is now made to FIG. 7, which describes the operation of improved memory card 120R of FIG. 2 at various stages of its lifecycle: steps 501-533 relate to the usage of the memory card with appliance 160, which may be, for example, a digital camera. Steps 533-549 relate to the improved memory card 120R when put for retirement in digital shoebox 180A of FIG. 2.

In step 501 improved memory card 120R (hereinafter referred to as "card 120R", for short) is inserted into the appliance 160. In step 505 digital content (e.g., as a picture file) is generated and sent by appliance 160 to card 120R for storage. In step 509, primary controller 128A checks whether primary memory 124A is already full, for storing the received content. If primary memory 124A is not full (shown as "N" at 509), which means that there is still sufficient storage space in primary memory 124A, then in step 521 it is determined whether the card 120R is set for real-time backup mode, i.e., that every piece of content is backed up in card 120R as soon as it is received from appliance 160. If card 120R is set for real-time backup mode (shown as "Y" at step 521), then in step 525 the content received from appliance 160 is written to both primary memory 124A and secondary memory 124B. If card 120R is not set for real-time backup mode (shown as "N" at step 521), then in step 529 the content is written only to primary memory 124A. If in step 509 the storage space in primary memory 124A is found to be full (shown as "Y" at 509), then at step 511 it is checked whether there is sufficient storage space in secondary memory 124B for the content. Secondary memory 124B will not have space for content in any of the following scenarios: (a) the secondary memory 124B is already full; (b) improved memory card 120R is preprogrammed to use secondary memory 12413 only for backup of primary memory 124A—either in real-time backup, as discussed in connection with step 525, or when card 120R is put for retirement in digital shoebox 180A; and (c) the user has selected, for example by using mode switch 138 of FIG. 2, the "full redundancy" mode, in order to dedicate secondary memory 124B to backup only. If any of these scenarios occurs (generally shown as "N" at step 511), then the write operation checked in step 511 will be rejected (in step 515) because an attempt to store content in secondary memory 124B under these circumstances is like attempting to write data to a full conventional memory card. If, however, it is found in step 511 that the content can be stored on secondary memory 124B (shown as "Y" at step 511), then in step 513 the content is added to (i.e., stored in the) secondary memory 124B. In step 533 it is checked whether card 120R is left in the appliance or it is put for retirement in digital shoebox 180A. If card 120R is left in the appliance (shown as "N" at step 533), then control returns to step 505 where the card can receive additional content from appliance 160.

It will be appreciated that using a card such as improved memory card 120R allows the user to choose between full redundancy and fill capacity modes. For example, a user may purchase a memory card for a digital camera, with a capacity of 2×1 GB. With real-time backup (see step 521) turned on, all pictures taken by the camera will be recorded on both primary memory 124A and secondary memory 124B, thus providing full data redundancy. After consuming the 1 GB capacity of the 2×1 GB card, the user can replace the card with another, thus maintaining full redundancy for the recorded data; this feature is beneficial if the user records indispensable content such as at a wedding or a class reunion. However, if the user takes pictures which are less important (for example, pictures taken during a weekend journey) and no replacement card is available, the user may prefer overwriting the content of the secondary memory 124B, thus trading redundancy for storage capacity by using the full 2 GB capacity of the card. Mode switch 138 of FIG. 2 can be configured to prevent unintentional overwriting content of secondary memory 124B so as to maintain full redundancy; then, the user will need to manually move mode switch 138 from "full redundancy" to "full capacity" setting to allow overwriting the content of secondary memory 124B.

Referring again to step 533 of FIG. 7, if the improved memory card 120R is removed from appliance 160 and inserted into a card slot 198S of card compartment 198 of digital shoebox 180 of FIG. 3 (shown as "Y" at step 533), then, in step 537, it is checked whether the secondary memory 124B of the card is available for backing up any part or portion of the content of primary memory 124A. Such availability, which may be checked, for example, by exchanging messages between shoebox controller 184 and primary controller 128A of the card, is affirmed: (a) if real-time backup is on (shown as "Y" at step 521) and secondary memory 124A already contains a copy of the content of primary memory 124A; (b) if real-time back-up is off (shown as "N" at step 521) and secondary memory 124B is still empty; or (c) if content (i.e., original content, not replicated content) was recorded into secondary memory 124B but the user managed to remove some content from one or both memories (i.e., content card and backup card) and move all the remaining content to primary memory 124A, thus emptying secondary memory 124B. Therefore, if it is found, in step 537, that secondary memory 124B is available for backup (shown as "Y" at step 537), then in step 541 secondary memory 124B is used for backup; nothing will happen in step 541 if secondary memory 124B already contains a copy of the content of primary memory 124A, a condition that exists if real-time backup was "on" in step 521. Otherwise, step 541 may include copying the content of primary memory 124A onto secondary memory 124B. If, however, it is found in step 537 that secondary memory 124B is unavailable for backup (shown as "N" at step 537), then in step 545 the user may be prompted, for example, by digital shoebox controller 184, to add a memory device for backing up the content of the newly-added improved memory card 120R, as described with respect to step 409 of FIG. 5. In step 549 the memory card is integrated into the virtual disk as presented by digital shoebox 180B, including all functionalities described with respect to steps 413, 417, and 421, of FIG. 5.

Figure 8:
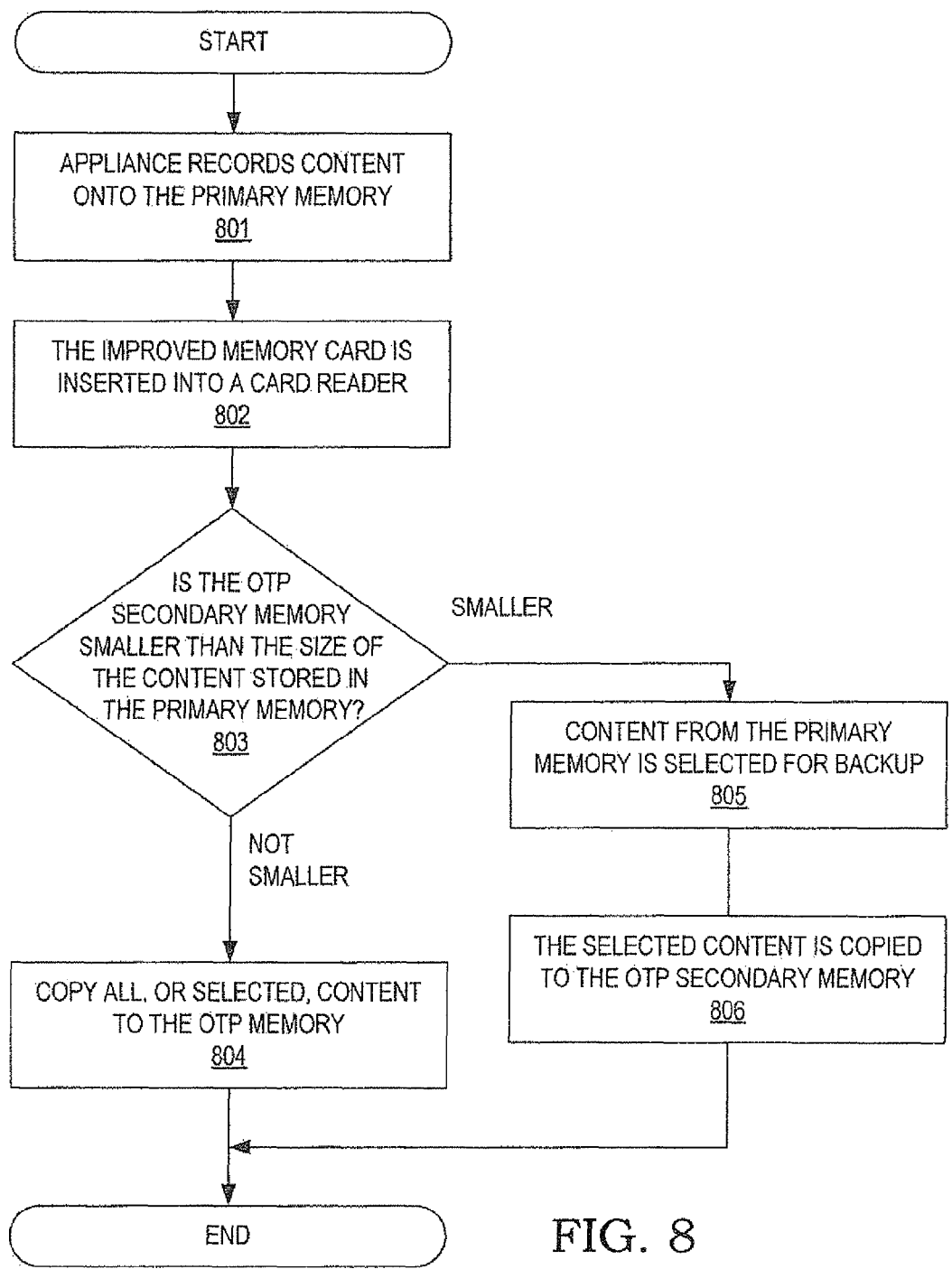
FIG. 8 shows a method for using an improved memory card in accordance with one example embodiment of the present disclosure.

FIG. 8 shows an exemplary method for operating an improved memory card which contains an OTP memory as the secondary memory. FIG. 8 will be described in association with FIG. 2, and secondary memory 124B is may but need not be an OTP memory. At step 801 appliance 160 (e.g., a camera) records content on primary memory 124A. OTP secondary memory 124B remains blank, or empty, as it is inaccessible to appliance 160 and to its human operator (i.e., the user). In other words, only primary memory 124A is available for recording genuine content, and, on the other hand, OTP secondary memory 124B cannot be used as a real-time backup under the presently-described example embodiment. If the user wants to backup content stored in primary memory 124A, the user removes improved memory card 120R from appliance 160 and, at step 802, inserts improved memory card 120R into a card reader (for example) which allows the user to manipulate (i.e., delete, copy, edit, etc.) content stored in primary memory 124A. At step 803 it is checked whether the OTP secondary memory 124B is smaller the current size of the content recorded in than primary memory 124A. If OTP secondary memory 124B is equal to, or greater than, the current size of the content recorded in primary memory 124A (shown as "not smaller" at 803), the user may decide, at step 804, to copy the entire contents, or only selected content, of primary memory 124A into OTP secondary memory 124B. If, however, OTP secondary memory 124B is smaller than the current size of the content recorded in primary memory 124A (shown as "smaller" at 803), the user can copy into OTP secondary memory 124B only a selected portion of the content recorded in primary memory 124A, the total size of which selected portion may be as large as the limited storage space available in OTP secondary memory 124B.

While the invention has been described with respect to a limited number of example embodiments, it will be appreciated by persons skilled in the art that the present invention is not limited by what has been particularly shown and described herein. Rather the scope of the present invention includes both combinations and sub-combinations of the various features described herein, as well as variations and modifications which would occur to persons skilled in the art upon reading the specification and which are not in the prior art.

What is claimed is:

1. A digital shoebox comprising:
   a card compartment for receiving a plurality of memory cards, at least one of the plurality of memory cards being a newly-added memory card containing digital content, each of the plurality of memory cards containing content; and
   a shoebox controller configured to detect the digital content of the newly-added memory card upon receiving the newly-added memory card in the card compartment, the shoebox controller causing allocation of backup storage for the digital content from available space in the plurality of memory cards, other than the newly-added memory card, and then copying the digital content to the allocated backup storage,
   wherein the shoebox controller is integrated with a card aggregator that logically aggregates the plurality of memory cards into a single virtual disk, and performs maintenance on one or more of the plurality of memory cards by refreshing content on specific ones of the plurality of memory cards.

2. The digital shoebox according to claim 1, wherein said maintenance further includes media quality monitoring of the plurality of memory cards and calling for user intervention if at least one of the plurality of memory cards has a media quality that falls below a predefined threshold.

3. The digital shoebox according to claim 1, wherein said maintenance further includes backing up content of one or more of the plurality of memory cards.

4. A method of archiving a plurality of memory cards using a digital shoebox, the digital shoebox having a card compartment for receiving the plurality of memory cards, a shoebox controller configured to maintain the plurality of memory cards, and a card aggregator, the method comprising:
   a) receiving a plurality of memory cards in the card compartment, at least one of the plurality of memory cards being a newly-added memory card containing digital content, each of the plurality of memory cards containing content;
   b) logically aggregating the plurality of memory cards into a single virtual disk through the shoebox controller;
   c) detecting the digital content contained in the newly-added memory card upon receiving the newly-added memory card in the card compartment;
   d) maintaining the plurality of memory cards, the maintaining includes
      searching by the shoebox controller, in the memory cards for a backup storage space into which digital content of the newly-added memory card can be copied;
      causing allocation of the backup storage space for the digital content from available space in the single virtual disk; and
   e) copying the digital content to the allocated backup storage.

5. The method according to claim 4, wherein a particular received memory card is an improved memory card, the content of the particular received memory card is stored in a primary memory of the particular received memory card, and the backup storage space is within a secondary memory of the particular received memory card.

6. The method according to claim 4, further comprising:
   prompting a user of the digital shoebox to insert in the digital shoebox an additional memory card for providing the backup storage space.

7. The method according to claim 4, wherein said maintenance includes periodically monitoring one or more of the received memory cards for content integrity.

8. The method according to claim 4, wherein said maintenance includes refreshing the content of one or more of the received memory cards.

9. The method according to claim 4, wherein said maintenance includes employing a maintenance routine, the maintenance routine comprising scanning the plurality of received memory cards and, for each scanned memory card;
   checking the data integrity and the media quality of the scanned memory card and
   calling for user intervention if the data integrity or media quality has decreased below a predefined threshold; and
   refreshing the content of the scanned memory card according to a predefined schedule or as needed under predefined criteria.

10. The method according to claim 9, wherein said calling for user intervention includes
   calling for insertion in the digital shoebox of an additional memory card to replace a memory card whose content integrity or media quality has decreased below the predefined threshold.

11. The method according to claim 9, wherein said calling for user intervention includes calling for copying the content of the scanned memory card to an external backup storage device.

12. The method according to claim 9, wherein said scanning is executed according to a predefined schedule.

13. A method of archiving a plurality of memory cards using a digital shoebox, the method comprising:
- a) receiving a plurality of memory cards in the card compartment, at least one of the plurality of memory cards being a newly-added memory card containing digital content, each of the plurality of memory cards containing content;
- b) detecting the digital content contained in the newly-added memory card upon receiving the newly-added memory card in the card department;
- c) causing allocation of a backup storage for the digital content of the newly-added memory card from available space in the plurality of memory cards, other than the newly-added memory card;
- d) copying the digital content to the allocated backup storage;
- e) checking, from time to time, a media quality of the plurality of memory cards, including the newly-added memory card, based on a level of error correction of digital content stored in the plurality of memory cards; and
- f) refreshing the digital content of specific one or more of the plurality of memory cards in response to a level of error correction exceeding a predefined level.

* * * * *